United States Patent

Hosomi et al.

[11] Patent Number: 5,773,888
[45] Date of Patent: Jun. 30, 1998

[54] SEMICONDUCTOR DEVICE HAVING A BUMP ELECTRODE CONNECTED TO AN INNER LEAD

[75] Inventors: Eiichi Hosomi; Chiaki Takubo, both of Kanagawa-ken; Hiroshi Tazawa, Chiba-ken; Koji Shibasaki, Kanagawa-ken, all of Japan

[73] Assignee: Kabushiki Kaisha Toshiba, Kawasaki, Japan

[21] Appl. No.: 555,392

[22] Filed: Nov. 9, 1995

[30] Foreign Application Priority Data

Nov. 12, 1994 [JP] Japan ................................... 6-302843

[51] Int. Cl.$^6$ .................................................. H01L 29/41
[52] U.S. Cl. ........................ 257/737; 257/751; 257/773; 257/779; 257/784
[58] Field of Search ................................... 257/737, 738, 257/751, 763, 779, 780, 766, 784, 786, 773

[56] References Cited

U.S. PATENT DOCUMENTS 5,473,197 12/1995 Idaka et al. ............................ 257/737
5,478,973 12/1995 Yoon et al. ............................. 174/260

FOREIGN PATENT DOCUMENTS 0159033 6/1990 Japan ..................................... 257/737

Primary Examiner—Peter Toby Brown
Attorney, Agent, or Firm—Banner & Witcoff, Ltd.

[57] ABSTRACT

A semiconductor device having bump electrodes, each having a structure wherein an alloy layer such as Au—Sn formed by the reaction between the Sn-plated layer on the surface of the inner lead and the bump electrode never reach the bottom surface of the passivation opening portion, is provided. The center of the passivation opening portion is displaced apart from the center of an electrode pad to a direction toward the center of the semiconductor substrate. The center of the passivation opening portion is displaced away from the outer lead and close to the tip end of the inner lead in contrast to the center of the bump electrode. By positioning the passivation opening portion such that the center thereof is located nearer to the center of semiconductor substrate than a center of the bump electrode, without changing the height of the bump electrode or the size of the passivation opening portion, the Au—Sn alloy etc. caused by the reaction between the Sn-plated layer of the inner lead and the metal layer of the bump electrode can be prevented from reaching the passivation opening portion.

7 Claims, 8 Drawing Sheets

SEMICONDUCTOR DEVICE HAVING A BUMP ELECTRODE CONNECTED TO AN INNER LEAD

BACKGROUND OF THE INVENTION

1. Field of the Invention

The present invention relates to a connection structure for use in a semiconductor device having bump electrodes.

2. Description of the Related Background Art

Conventionally, in a semiconductor device which is packaged by TAB (Tape Automated Bonding) technology, normally projection-like metal electrodes (referred to as bump electrodes hereinafter) are formed on electrode pads. With reference to FIGS. 10 to 12, a conventional semiconductor device will be explained. FIG. 10 is a sectional view of the semiconductor device having the bump electrodes, FIG. 11 is a plan view of the bump electrode, and FIG. 12 is a sectional view of the semiconductor device in which inner leads are connected to the bump electrodes. An integrated circuit is formed on a semiconductor substrate 1 such as a silicon substrate. This integrated circuit is electrically connected to electrode pads 2 formed of a metal such as Al which are formed on a surface of the semiconductor substrate 1. A passivation film 3 made of silicon nitride etc. is formed on an entire surface of the semiconductor substrate 1 including the electrode pad 2. Passivation opening portions 9 are formed at predetermined locations so as to expose the electrode pads 2, so that part of a surface of each of the electrode pad 2 is exposed. Ordinarily, the passivation opening portion denotes a space having a square pillar shape, which has a bottom area wherein the passivation film is not formed on the electrode pad, and a height equal to a thickness of the passivation film.

Bump electrodes 5 are stacked on respective passivation opening portions 9. Ordinarily, the bump electrodes 5 are displaced such that each center A thereof coincides with a center B of the passivation opening portion 9. In addition, barrier metal layers 4 are formed on areas wherein the electrode pads 2 are exposed and peripheral areas of the passivation opening portions are formed in the passivation film 3 so as to stabilize contact resistance. The barrier metal layer is normally formed of metal thin foils having two layers or more. In this example, the barrier metal layer 4 is constructed by a multilayered film made of a first barrier metal layer 41, a second barrier metal layer 42, and a third barrier metal layer 43. The first barrier metal layer 41 is made of Ti, the second barrier metal layer 42 is made of Ni, and the third barrier metal layer 43 is made of Pd. The bump electrode 5 is formed on the third barrier metal layer 43.

The first barrier metal layer 41 contacts the electrode pad 2. In the case of a semiconductor device which is packaged by use of the TAB tape, Au can be employed as the bump electrode material. Inner leads of TAB leads included in the TAB tape are connected to the bump electrodes (ILB (Inner Lead Bonding)). A Sn-plated layer 7 is formed on a surface of the inner lead 8. Heat and pressure are applied to the inner lead 8 and the Au bump 5 to connect them to each other while the inner lead 8 and the Au bump 5 are contacted. In this case, an alloy 6 such as Au—Sn alloy, Au—Cu alloy or Au—Cu—Sn alloy formed by a eutectic reaction between Au and Sn in the plated layer is formed (FIG. 12). Because of this alloy, junction strength between the inner lead 8 and the bump electrode 5 can be assured.

The alloy 6 such as Au—Sn caused by the junction of the bump electrode 5 and the inner lead 8 is mainly formed in the region of the bump electrode 5 located away from the center of the semiconductor substrate. This is because, during the melting step, Sn in the portion of the inner lead 8 is not in contact with the bump electrode 5 (if taken as wide as possible, Sn in the outer lead is also included) reacts to Au. When the inner lead 8 is connected to the bump electrode 5, a tip portion of the inner lead 8 is displaced toward a center of the semiconductor substrate 1, and other portion connected to the outer lead is displaced so as to project from a side opposed to the center of the semiconductor substrate. Here, the region of the bump electrode 5 located away from the center of the semiconductor substrate is defined as the side region of the semiconductor substrate 1 from which the inner leads extend.

In addition, as shown in FIG. 12, when the tip portion of the inner leads 8 is prolonged beyond the bump electrodes 5, the alloy such as Au—Sn is formed dominantly in the region of the bump electrode 5 closest to the center of the semiconductor substrate (thickness "a").

However, the amount of the alloy is less than that derived from the region located away from the center of the semiconductor substrate (thickness "h"). Accordingly, an eduction amount of the alloy becomes different according to the regions in the bump electrode. First, the greatest amount of the alloy 6 is educed in the region spanning from a side of the bump electrode 5 in the direction where one end of the inner lead to be connected to the outer lead is displaced, to a nearest side of the passivation opening portion 9 (the region in the bump electrode located away from the center of the semiconductor substrate). Conversely, the least amount of the alloy 6 is educed in the region spanning from the neighbor area of the side of the passivation opening portion 9 to the neighbor area of the side of the bump electrode 5 near the center of the semiconductor substrate. An intermediate amount of the alloy 6 is educed in the region of the side of the bump electrode 5 near the center of the semiconductor substrate (the region of the bump electrode nearest to the center of the semiconductor substrate).

For instance, in FIG. 12, if the height of the bump electrode 5 is 16 microns, a thickness of "a" Au—Sn alloy in the region of the bump electrode 5 nearest to the center of the substrate is 5 microns, and a thickness "b" of Au—Sn alloy in the region of the bump electrode 5 near the center of the bump electrode 5 is 3 microns. The reason why the thickness of the alloy 6 in the region of the bump electrode 5 nearest to the center of the substrate is larger than the thickness of the alloy near the center of the bump electrode 5 is that, if the tip portion of the inner lead 8 is located outside of the bump electrode 5, the Sn-plated layer 7 on the inner lead 8 is not in contact with to the bump electrode 5 is also caused to be melted to react to the bump electrode 5.

In the area of the bump electrode 5 located most away from the center of the substrate, the Au—Sn alloy has a thickness which reaches the barrier metal layer 4. A distance between the tip portion of the Au—Sn alloy and the end of the bump electrode is 14 microns. The tip portion of the Au—Sn alloy enters into the passivation opening portion. The bump electrode 5 is fine-patterned according to miniaturization of the semiconductor device, and therefore a height thereof becomes low. In this case, like the example in FIG. 12, there are some areas where the Au—Sn alloy 6 reaches the passivation opening portion 9. The barrier metal layers 4 formed between the bump electrodes 5 and the electrode pads 2 serve to prevent the reaction of Au and Al in the electrode pads and is not considered to prevent the reaction of Au and Sn. When Sn reaches the passivation opening portion 9, an alloy is formed by reaction to the barrier metal layer 4. As a result, there is a possibility that deterioration in contact strength or electric failure between the bump electrode 5 and inner lead occurs.

In order to prevent this, it can be considered to form a high bump electrode 5. However, since the bump electrode 5 is normally formed by plating, the time required to form the bump electrode 5 is increased and throughput is decreased if the bump electrode 5 is formed to be in excess of 20 microns, for example. In addition, although the passivation opening portion 9 which is formed to be smaller than the conventional one may be considered, this method is inadvisable because electric resistance is increased.

SUMMARY OF THE INVENTION

The present invention has been made in view of these circumstances, and has an object to provide a semiconductor device having bump electrodes, each having a new structure wherein an alloy layer such as Au—Sn formed by the reaction between a Sn-plated layer on the surface of the inner lead and the bump electrode never reaches the passivation opening portion.

In order to overcome the above drawback, in the present invention, the center of the passivation opening portion is displaced apart from the center of an electrode pad to a direction toward the center of the semiconductor substrate. In other words, the center of the passivation opening portion is displaced away from the outer lead and close to the tip portion of the inner lead in contrast to the center of an electrode pad.

More particularly, a semiconductor device according to the present invention includes a semiconductor substrate on which semiconductor elements are formed, electrode pads formed on the semiconductor substrate and electrically connected to the semiconductor elements, a passivation film formed on an entire surface of the semiconductor substrate including the electrode pads and having opening portions for exposing selected areas of the electrode pads, barrier metal layers formed on the electrode pads, the passivation film in peripheral areas of the opening portions, and sidewalls of the opening portions, bump electrodes formed on the barrier metal layers, and inner leads one end of each connected to outer leads and the other end of each connected to the bump electrodes, wherein a tip portion of each of the inner leads extends from a side of the bump electrode nearest an edge of the semiconductor substrate to a side opposite the edge, and the center of each opening portion is located closer to the side opposite the edge than to a center of a corresponding electrode pad.

By positioning the passivation opening portion such that the center thereof is located nearer to the center of the semiconductor substrate than a center of the electrode pad, the aforementioned drawbacks can be prevented, without changing the height of the bump electrode or the size of the passivation opening portion. Moreover, the Au—Sn alloy etc. caused by the reaction between the Sn-plated layer of the inner lead and the metal layer of the bump electrode does not reach the passivation opening portion.

BRIEF DESCRIPTION OF THE DRAWINGS

Other objects and advantages of the present invention will become apparent during the following discussion in conjunction with the accompanying drawings in which.

DETAILED DESCRIPTION OF THE PREFERRED EMBODIMENT

Figure 1:
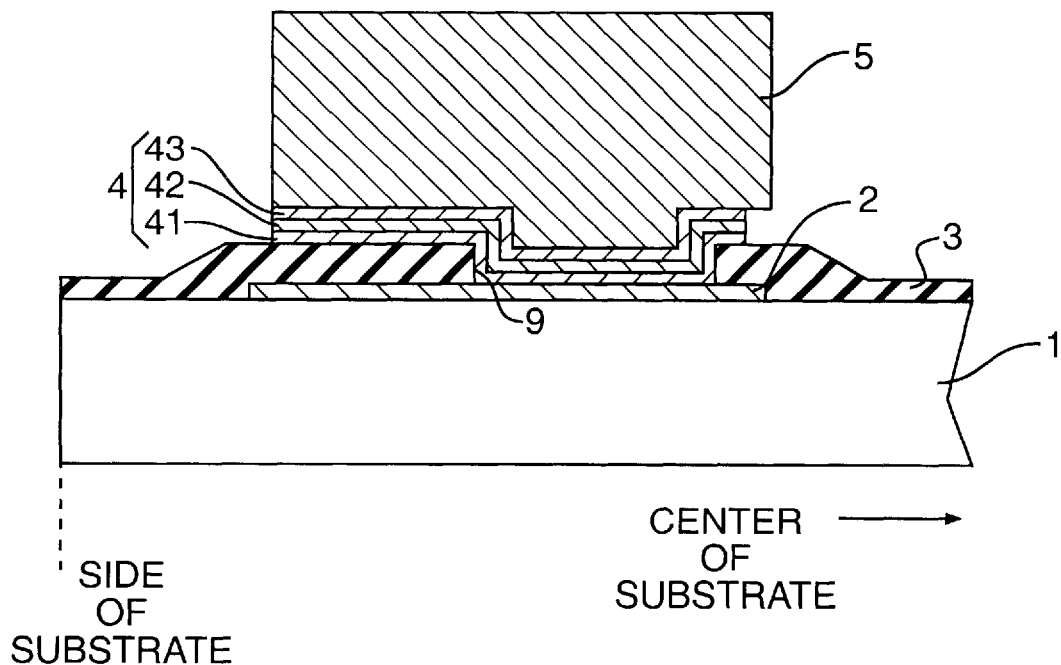
FIG. 1 is a sectional view showing a semiconductor device according to an embodiment of the present invention.
Figure 2:
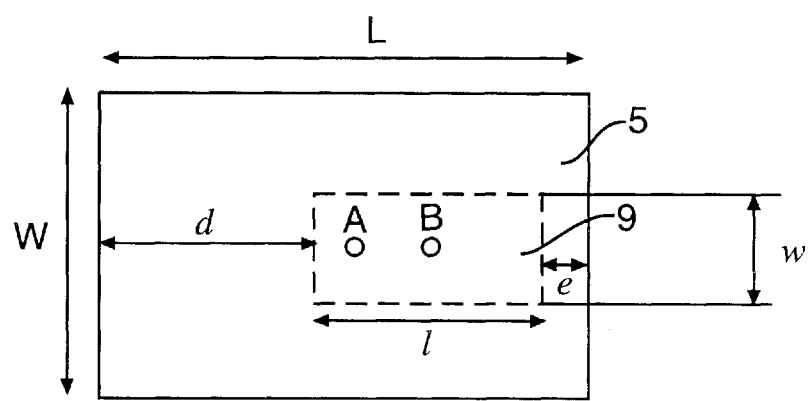
FIG. 2 is a plan view showing the bump electrode portion in FIG. 1.
Figure 3:
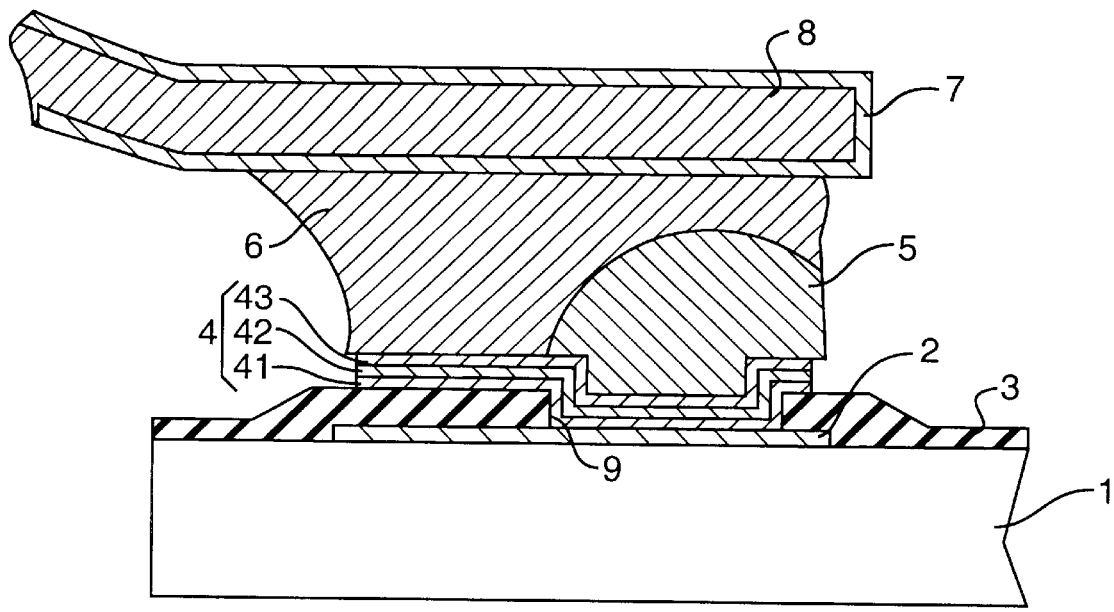
FIG. 3 is a sectional view showing a semiconductor device according to an embodiment of the present invention.

An embodiment of the present invention will be described with reference to FIGS. 1 to 3. FIG. 1 is a sectional view of a semiconductor device having bump electrodes, FIG. 2 is a plan view of the bump electrode, and FIG. 3 is a sectional view of the semiconductor device in which inner leads are connected to the bump electrodes.

As shown in FIG. 1 for instance, a semiconductor device such as integrated circuit is formed on a semiconductor substrate 1 made of a silicon semiconductor. The semiconductor device is electrically connected to a metal electrode pad 2 such as Al formed on a surface of the semiconductor substrate 1. A plurality of the electrode pads 2 are formed along a side surface of the semiconductor substrate 1 and remotely from a central portion of the semiconductor substrate 1. The electrode pads 2 are arranged along predetermined sides of the semiconductor substrate 1. However, the electrode pads need not be aligned, and some of them may be arranged in inner areas located slightly closer to the center of the semiconductor substrate. A left side of the semiconductor substrate 1 shown in FIG. 1 corresponds to one of the predetermined sides, and the center of the semiconductor substrate is located on the right side of FIG. 1. A passivation film 3 such as silicon nitride is formed on an entire surface of the semiconductor substrate 1 including the electrode pads 2. Note that the silicon oxide, polyamide, PSG or the like may be used as the passivation film material 3.

Passivation opening portions (window portions) 9 are formed in predetermined areas of the passivation film 3 so as to expose the electrode pads 2 therefrom. As a result, part of the surface of the electrode pads 2 is exposed from the opening portions 9. In addition, in order to stabilize contact resistance, barrier layers 4 are formed in areas wherein the electrode pads 2 are exposed and peripheral areas of the passivation opening portions 9 in the passivation film 3. Ordinarily, the barrier layers 4 are formed of two or more layered metal thin foils. In this embodiment, the barrier metal layer 4 is constructed by a multilayered film of a first barrier metal layer 41, a second barrier metal layer 42, and a third barrier metal layer 43. For instance, the first barrier metal layer 41 is made of Ti, the second barrier metal layer 42 is made of Ni, and the third barrier metal layer 43 is made of Pd. The thickness of the first barrier metal layer 41 is about 0.15 micron, the thickness of the second barrier metal layer 42 is about 0.3 micron, and the third barrier metal layer 43 is 0.05 micron. The barrier metal layer 4 could be two layered metals, e.g. Ti and Ni. The bump electrode 5 is formed on the third barrier metal layer 43. The first barrier metal layer 41 contacts the electrode pads 2. The bump electrodes, to which leads of the TAB tape are connected, are normally made of Au material. Further, Cu or Cu alloy etc. may be utilized as material of the leads of the TAB tape.

Figure 11:
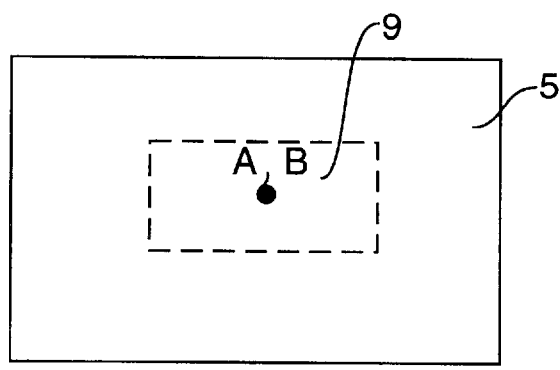
FIG. 11 is a sectional view showing a conventional semiconductor device.

Here, the passivation opening portion is a space having a square pillar shape which has a bottom area wherein the passivation film is not formed on the electrode pad and a height equal to a thickness of the passivation film. The bump electrodes are formed so as to be disposed in arbitrary areas on the passivation opening portions. However, in the conventional art (see FIG. 11), both a center "B" of the bottom surface of the passivation opening portion 9 and a center "A" of the bottom surface of the bump electrode 5 are displaced in substantially identical areas.

Figure 12:
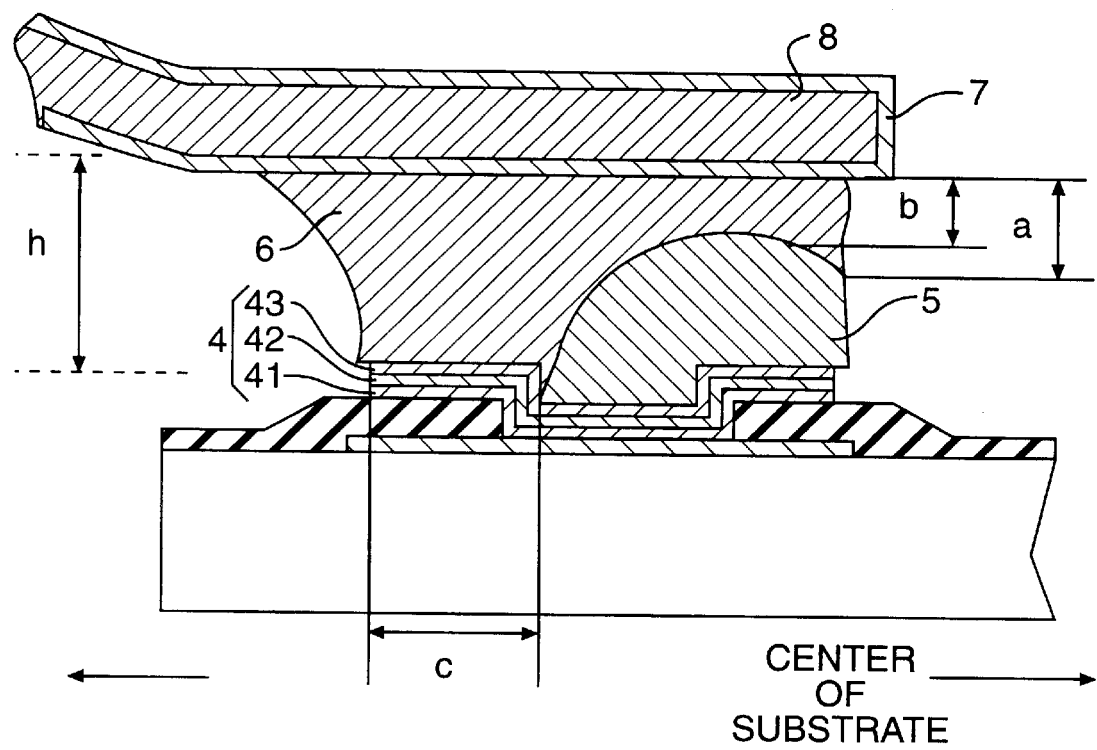
FIG. 12 is a sectional view showing a conventional semiconductor device.

In contrast, as shown in FIG. 2, in the present invention, the passivation opening portion 9 is formed with its center offset from a center of the bump electrode 5 toward a center of the semiconductor substrate 1. In other words, when the inner lead 8 is connected to the bump electrode 5, the passivation opening portion 9 is disposed adjacent to a certain side of the bump electrode 5 near the center of the semiconductor substrate 1. More particularly, the center "B" of the passivation opening portion 9 is located nearer to the center of the semiconductor substrate than the center "A" of the bump electrode 5. A distance "d" from a certain side of the bump electrode 5, from which the passivation opening portion 9 is displaced at a longest distance, to a side of the passivation opening portion 9, which is displaced at a nearest distance from the certain side of the bump electrode 5, can be set to be more than 14 microns. If the distance "d" is within this range, an alloy layer 6 such as Au—Sn layer never enters into the area of the passivation opening portion 9 (compare FIG. 3 with FIG. 12). Thus, a possibility of deterioration in contact strength or electric failure of the bump electrode can be decreased.

The tip portion of the inner lead 8 is positioned near the side which is located near the center of the semiconductor substrate 1. The outer lead portion formed oppositely to the tip portion is displaced near a predetermined side of the bump electrode 5 on the semiconductor substrate as shown in FIG. 3. On the other hand, a distance "e" spanning from a side of the bump electrode 5 to which the passivation opening portion 9 is displaced at a shortest distance, i.e., from a side of the bump electrode 5 close to the center of the semiconductor substrate 1 to a side of the passivation opening portion 9, which is displaced at a shortest distance from the side of the bump electrode 5, is set to be smaller than the distance "d".

In this embodiment, a width "W" of the bump electrode 5 is set about 40 microns, and a length "L" thereof is set about 70 microns. Further, a width "w" of the passivation opening portion 9 is set about 20 microns, and a length "l" thereof is set 50 microns. A width of the inner lead 8 is set about 20 to 30 microns.

As shown in FIG. 3, when the semiconductor device is fabricated by use of the TAB tape, Au is used as material of the bump electrode 5. Then, the inner leads 8 of the TAB tape are connected to the bump electrode 5. In particular, the inner leads 8 are mounted on the bump electrodes 5 by mounting the TAB tape on the semiconductor substrate 1. Then, the bump electrodes 5 are connected continuously to the inner leads 8. Outer leads (not shown) which are displaced so as to extrude from the package of the semiconductor device are displaced outside a side of the bump electrode 5 away from the center of the semiconductor substrate 1, i.e., outside a left side in FIG. 3 close to a predetermined side of the semiconductor substrate. The tip portions of the inner lead 8 protrude from a side (right side in FIG. 3) of the bump electrode 5 close to the center of the semiconductor substrate 1 to outside of the bump electrode. Since a Sn-plated layer 7 is formed on the surface of the inner lead 8, a Au—Sn alloy layer 6 is formed by eutectic reaction between the bump electrode and Sn included in the Sn-plated layer when the inner lead 8 and the Au bump electrode 5 are joined together by thermocompression bonding. Junction strength between the inner lead 8 and the bump electrode 5 can be assured because of the alloy layer 6 such as Au—Sn.

However, if the alloy layer 6 such as Au—Sn enters the passivation opening portion 9 and reaches the bottom surface thereof, Sn reacts to Al in the barrier metal or the electrode pad 2, so that the contact characteristic of the bump electrode 5 is lowered and electric failure occurs. Although the alloy layer 6 such as Au—Sn is formed to have the substantially the same amount as the conventional example, the Au—Sn alloy layer 6 does not reach the passivation opening portion 9 at all since the passivation opening portion 9 is positioned near to a center of the semiconductor substrate 1 in the bump electrode 5.

Figure 4:
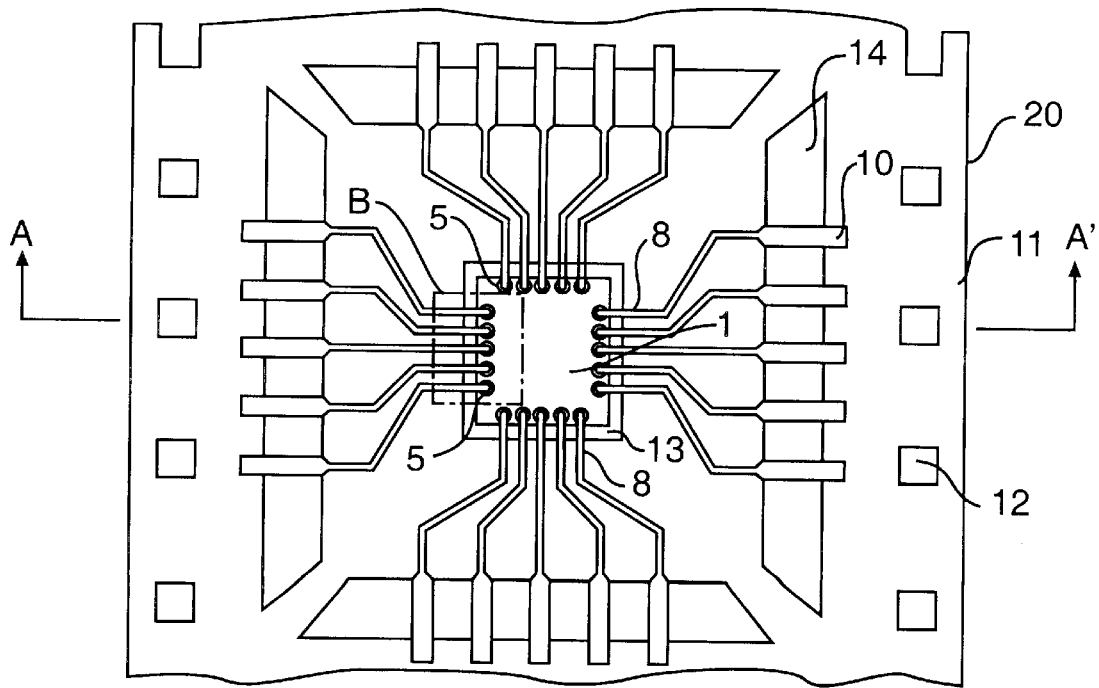
FIG. 4 is a plan view showing a TAB tape according to the embodiment of the present invention.

Subsequently, with reference to FIGS. 4 to 7, a semiconductor device employing bump electrodes each having a new structure according to the embodiment will be explained. FIG. 4 is a plan view showing the TAB tape mounting the semiconductor substrate (semiconductor chip) thereon, FIG. 5 is a sectional view showing the plastic sealed semiconductor device taken along a line A–A' in FIG. 4 and FIGS. 6 and 7 are enlarged plan views showing a "B" region in FIG. 4.

A film 11 used as a base material of the TAB tape (film carrier) is formed by an insulating material which is made of a flexible plastic material such as polyamide, polyester or the like. The film 11 is a stripe material. Carriage holes 12 used to carry the film are formed at a selected distance on both side edges of the film. A substrate mounting opening 13 for mounting the semiconductor substrate 1 therein is formed in the central portion in the longitudinal direction of the film 11. Long trapezoid openings 14 are formed oppositely to respective sides of the opening 13 at a certain distance. Leads of the TAB tape 20 are disposed in the regions between the opening 13 formed in the central portion of the tape and the trapezoid openings 14 formed in the peripheral portions of the tape. A central portion of the lead corresponds to the inner lead 8 and an outer portion supported by the trapezoid openings 14 corresponds to the outer lead 10. Ordinarily, the leads are formed by sticking a metal foil such as Cu or Cu alloy on an entire surface of the film and then patterning the metal foil by photoetching or the like. The lead is plated by Sn etc. The inner leads 8 are connected to the bump electrodes 5 which are formed respectively on a plurality of electrode pads formed on the semiconductor substrate 1. Although the leads protrude from the semiconductor substrate 1 in four directions in this embodiment, there is a type wherein the leads protrude in two opposed directions and there are various kinds of the leads pattern.

Figure 5:
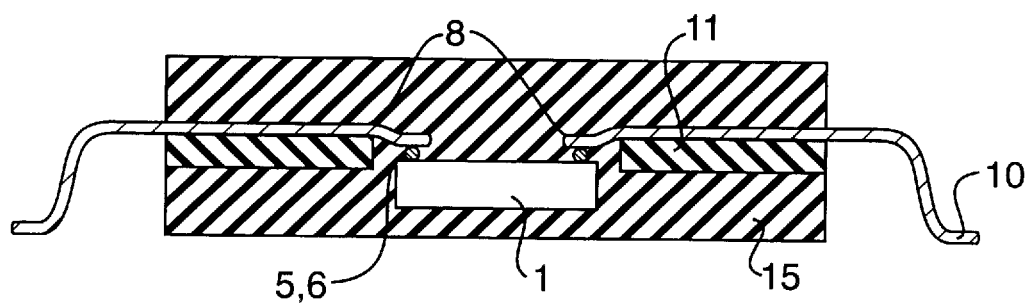
FIG. 5 is a sectional view showing an embodiment of the present invention.

After the semiconductor substrate 1 is mounted on the TAB tape 20, the inner leads 8 are contacted to the bump electrodes 5 and the alloy layers 6 are connected to the electrode pads, the TAB tape 20 in selected areas and the semiconductor substrate 1 is packaged by the plastic sealing material 15 such as epoxy resin (refer to FIG. 5). Unnecessary portions of the leads and the film on the plastic sealed TAB tape 20 are cut and removed. FIG. 5 is a sectional view showing the semiconductor device taken along a line A–A' in FIG. 4, and the semiconductor substrate 1 and its peripheral areas are packaged by the plastic sealing material 15. The semiconductor substrate 1, the inner leads 8 and the film 11 are sealed by the plastic sealing material 15. The outer leads 10 protrude from the plastic sealing material 15.

Figure 6:
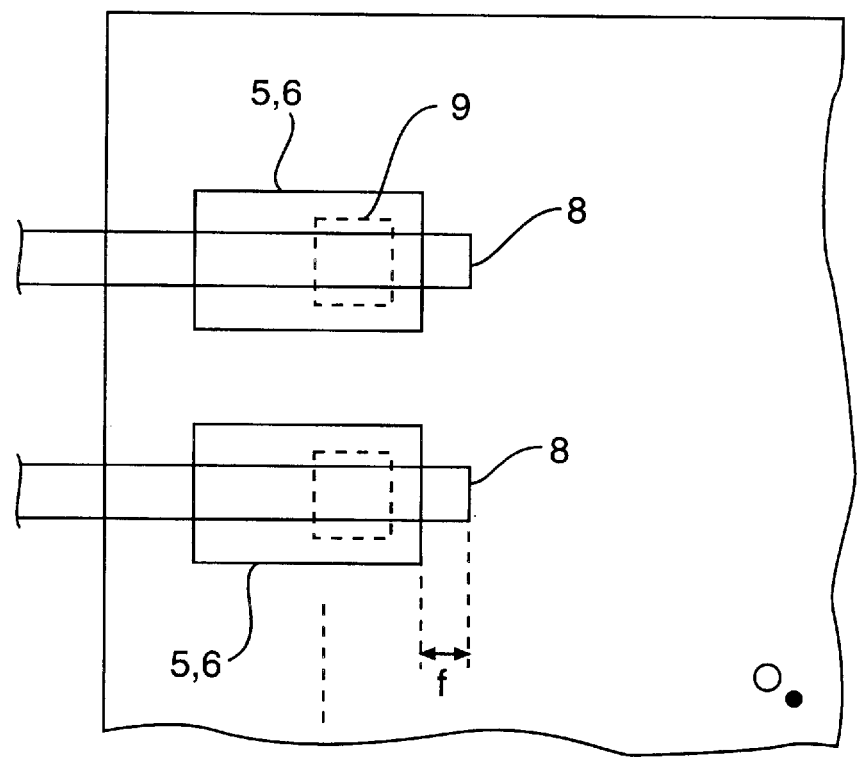
FIG. 6 is a plan view showing the bump electrode portion on the semiconductor substrate according to an embodiment of the present invention.
Figure 7:
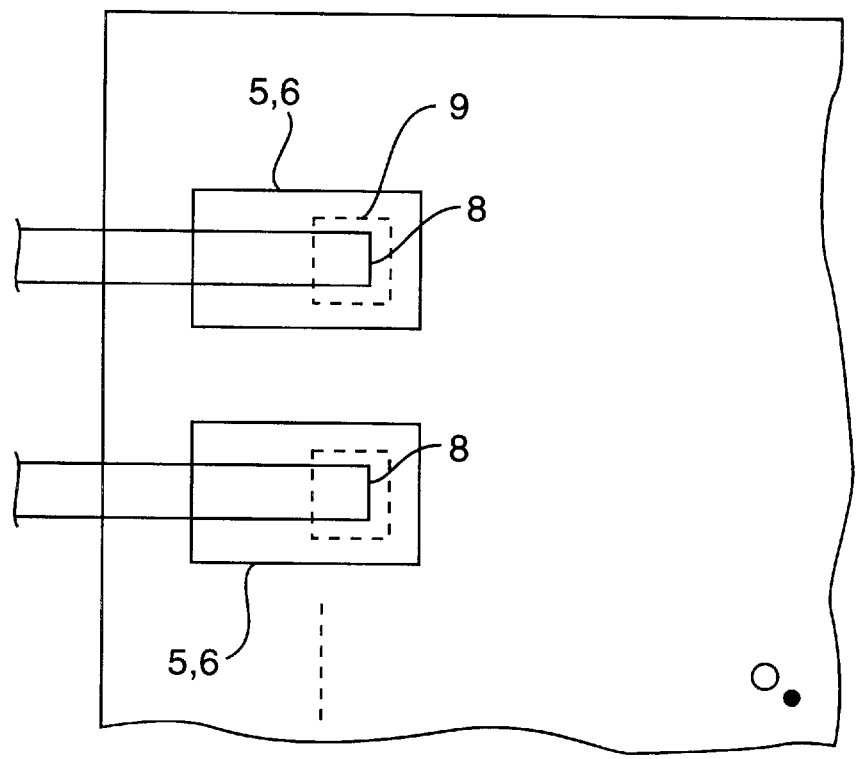
FIG. 7 is a plan view showing the bump electrode portion on the semiconductor substrate according to an embodiment of the present invention.

FIG. 6 is a view illustrating connections between the bump electrodes and the inner leads. A plurality of Al electrode pads are formed along sides of the semiconductor substrate 1. Au bump electrodes are formed thereon via the passivation opening portions 9 formed in the passivation film (not shown). The inner leads 8 are contacted respectively to the bump electrodes 5 and the alloy layers 6. The tip portions of the inner leads 8 protrude toward the center "0" of the semiconductor substrate 1 beyond the bump electrodes 5 and the alloy layers 6 by a selected distance "f". Portions which are connected to the outer leads located oppositely to the tip portions protrude from the semiconductor substrate 1.

FIG. 7 shows another example of the inner leads connection. In the example in FIG. 6, the tip portions of the inner leads 8 protrude toward the center of the semiconductor substrate outside the bump electrodes 5. But, note that the tip portions of the inner leads 8 may be located inside of the sides of the bump electrodes 5 so as not to reach the side of the bump electrodes 5 close to the center "0" of the substrate.

Figure 8A:
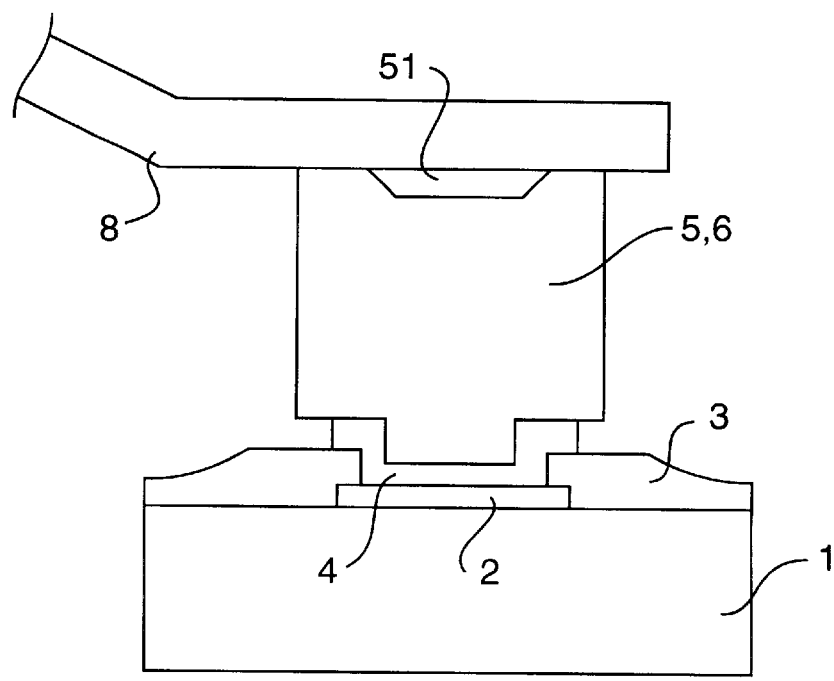
FIG. 8A is a front view showing the bump electrode and its near portion in FIG. 6 on the semiconductor substrate.
Figure 8B:
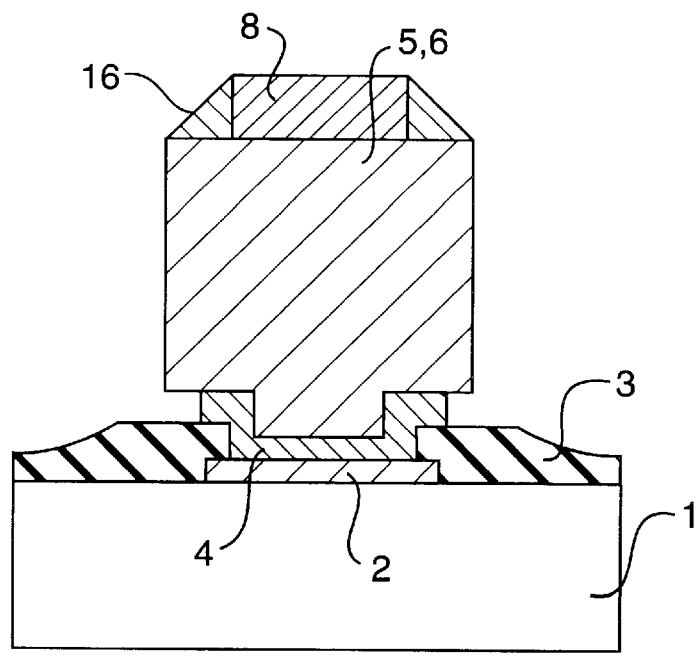
FIG. 8B is a side sectional view showing the bump electrode and its rear portion in FIG. 6 on the semiconductor substrate.
Figure 9A:
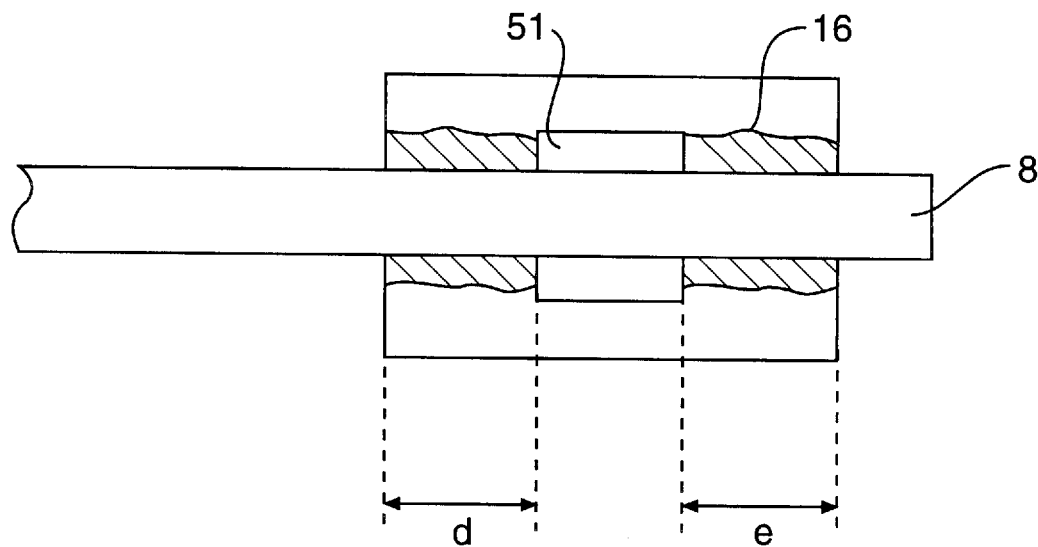
FIG. 9A is a plan view showing the bump electrode in FIG. 12 and the tip end of the inner lead formed to be contacted thereto.
Figure 9B:
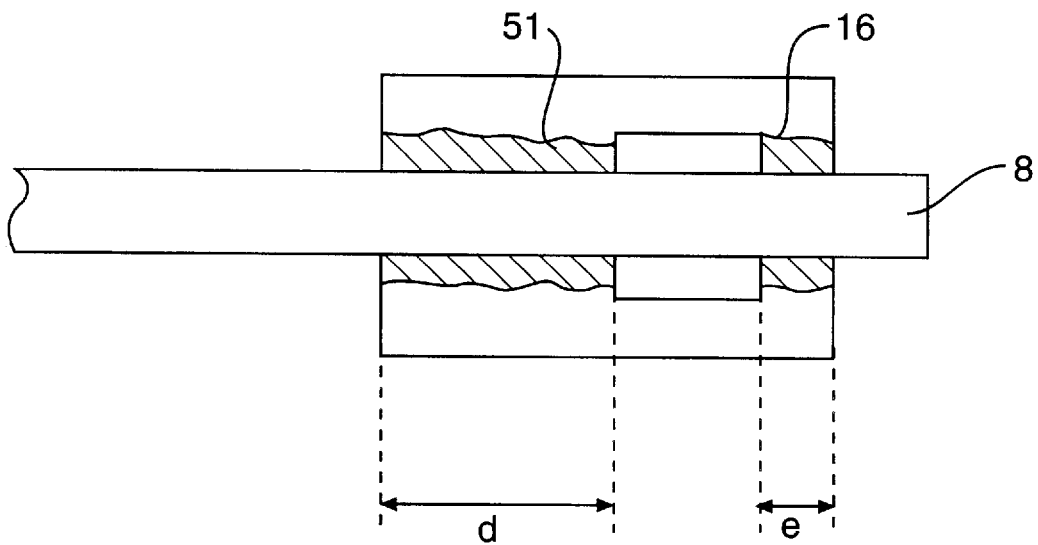
FIG. 9B is a plan view showing the bump electrode in FIG. 6 and the tip end of the inner lead formed to be contacted thereto.
Figure 10:
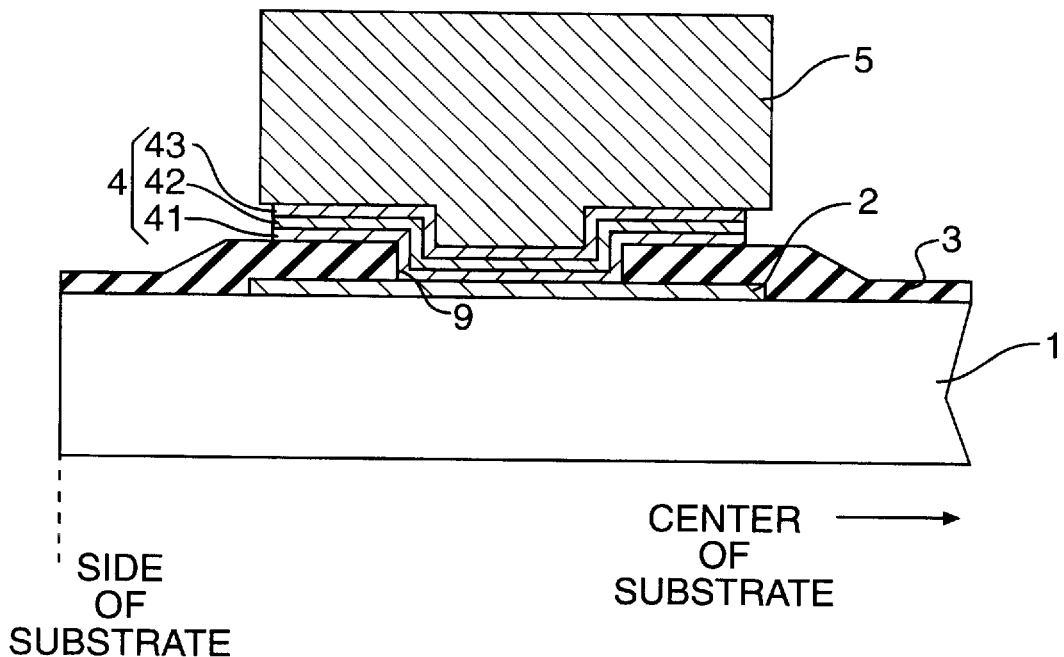
FIG. 10 is a sectional view showing a conventional semiconductor device.

Next, with reference to FIGS. 8A, 8B and 9A, 9B, a detailed structure of the bump electrode and a location relation between the bump electrode and the passivation opening portion will be explained. FIG. 8A and 8B are a front and side sectional view showing the bump electrode in FIG. 6 and their neighbor structure on the semiconductor substrate. FIG. 9A and 9B are a plan view showing the bump electrode and the tip portion of the inner lead thereon.

As has been described above, when the tip portions of the inner leads 8 are connected to the bump electrodes 5, the side surfaces of the inner leads 8 and the upper surfaces of the bump electrodes 5 are alloyed because of the Sn-plated layer formed on the surface of the inner leads 8 such that part of the bump electrodes 5 may be changed into an alloy layer 6 such as Au—Sn. Consequently, alloy fillet portions 16, each having a triangular sectional shape, are formed between the side surface of the bump electrodes 5 and the upper surface of the bump electrodes 5, i.e., on both side of the tip portions of the inner leads 8. These fillet portions 16 can assure junctions between the bump electrodes and the inner leads. Therefore, the longer the fillet portions 16 become, the larger the mechanical strength becomes. In order to inspect the junction state, the fillet portions 16 are inspected by use of the magnifying glass or the like.

In the meanwhile, the bump electrode 5 has been set forth to have a flat upper surface, as shown in FIG. 1 etc.

However, since actually the bump electrode 5 is formed on the passivation film 3 on the semiconductor substrate 1 and also on the passivation opening portion 9 on the electrode pad 2, its upper surface is not actually flat but is formed as concave portion 51 (FIG. 8A). Therefore, the inner lead 8 cannot contact the bump electrode 5 in this concave portion 51 and therefore a fillet portion 16 is interrupted there. In the prior art, since the passivation opening portion 9 is located at a substantially central area of the bump electrode 5, the fillet portion 16 is equally divided (d=e), as shown in FIG. 9A. Hence, the contact strength cannot be improved and it is difficult to inspect the fillet portion 16 by use of a magnifying glass. In contrast, in the present invention, if the passivation opening portion, i.e., the passivation film concave portion 51, is shifted to be positioned away from a side of the semiconductor substrate 1, the fillet portion becomes long on the side of the fillet portion 16 near the root of the tip end of the inner lead 8 (d>e). Consequently, the contact strength can be improved and the inspection can be easily effected (FIG. 9B).

As described above, in the present invention, without requiring a height of the bump electrode in excess of 20 microns or the size of the passivation opening portion smaller than the conventional passivation opening portion, an alloy layer such as Au—Sn formed by the eutectic reaction between the Sn-plated layer on the surface of the inner lead and the bump electrode never reaches the passivation opening portion. As a result, minute bump electrodes can be formed with high reliability.

What is claimed is:

1. A semiconductor device comprising:

a semiconductor substrate on which semiconductor elements are formed;

electrode pads formed on the semiconductor substrate and electrically connected to the semiconductor elements;

a passivation film formed on a surface of the semiconductor substrate including the electrode pads and having opening portions for exposing selected areas of the electrode pads;

barrier metal layers formed on the electrode pads, on the passivation film in peripheral areas of the opening portions, and on sidewalls of the opening portions;

bump electrodes made of Au and having less than 20 microns height formed on the barrier metal layers, and fully covering the opening portions;

inner leads having surfaces of Sn-plated layers respectively, a first end of each connected to a corresponding outer lead and a second end thereof connected to one of the bump electrodes; and Au—Sn alloy layers directly formed on the barrier metal layers and the bump electrodes and beneath the inner leads, and having less than 20 microns height;

wherein a tip portion of each inner lead extends from a side of one of the bump electrodes nearest an edge of the semiconductor substrate to a side opposite the edge, and the center of each of the opening portions in the passivation film is located closer to the side opposite the edge than to a center of a corresponding electrode pad.

2. A semiconductor device according to claim 1, wherein a distance spanning from a side of each of the bump electrodes nearest and edge of the semiconductor substrate to a side of each of the opening portions nearest to the certain side of each of said bump electrodes is set to be more than 14 microns.

3. A semiconductor device comprising:

a semiconductor substrate on which semiconductor elements are formed;

electrode pads formed on the semiconductor substrate and electrically connected to the semiconductor elements;

a passivation film formed on a surface of the semiconductor substrate including the electrode pads and having window portions for exposing selected areas of the electrode pads;

barrier metal layers formed on the electrode pads, on the passivation film in peripheral areas of the window portions, and on sidewalls of the window portions;

bump electrodes made of Au and having less than 20 microns height formed on the barrier metal layers, and fully covering the window portions;

inner leads having surfaces of Sn-plated layers respectively, a first end of each connected to a corresponding outer lead and a second end thereof connected to one of the bump electrodes; and Au—Sn alloy layers directly formed on the barrier metal layers and the bump electrodes, and beneath the inner leads, and having less than 20 microns height;

wherein a center of each window portion is respectively displaced away from a center of a corresponding electrode pad in a direction toward the center of the semiconductor substrate.

4. A semiconductor device comprising:

a semiconductor substrate on which semiconductor elements are formed;

electrode pads formed on the semiconductor substrate and electrically connected to the semiconductor elements;

a passivation film formed on a surface of the semiconductor substrate including the electrode pads and having window portions for exposing selected areas of the electrode pads;

barrier metal layers formed on the electrode pads, on the passivation film in peripheral areas of the window portions, and on sidewalls of the window portions;

bump electrodes made of Au and having less than 20 microns height formed on the barrier metal layers, and fully covering the window portions;

inner leads having surfaces of Sn-plated layers respectively, a first end of each connected to one of the bump electrodes; and Au—Sn alloy layers directly formed on the barrier metal layers and the bump electrodes, and beneath the inner leads, and having less than 20 microns height;

wherein a center of each window portion is respectively located apart from a center of a corresponding electrode pad in the direction of the semiconductor substrate.

5. A semiconductor device comprising:

a semiconductor substrate on which semiconductor elements are formed;

electrode pads formed on the semiconductor substrate and electrically connected to the semiconductor elements;

a passivation film formed on a surface of the semiconductor substrate including the electrode pads and having opening portions for exposing selected areas of the electrode pads;

a barrier metal layer formed on the electrode pads, on the passivation film in peripheral areas of the opening portions, and on sidewalls of the opening portions;

bump electrodes comprising Au and having less than 20 microns height formed on the barrier metal layer, and fully covering the opening portions;

inner leads having Sn-plated surfaces, a first end of each connected to a corresponding outer lead and a second end thereof connected to one of the bump electrodes; and Au—Sn alloy layers directly formed on the barrier metal layer and the bump electrodes and beneath the inner leads but not in contact with the opening portions;

wherein a tip portion of each inner lead extends from a side of one of the bump electrodes nearest an edge of the semiconductor substrate to a side opposite the edge, and the center of each of the opening portions in the passivation film is located closer to the side opposite the edge than to a center of a corresponding electrode pad.

6. The device of claim 5, wherein each window portion has a width which is about half the width of each bump electrode.

7. The device of claim 5, wherein each window portion has a length which is about five sevenths the length of each bump electrode.

* * * * *